(12) United States Patent
Liu et al.

(10) Patent No.: US 8,842,462 B2
(45) Date of Patent: Sep. 23, 2014

(54) RESISTIVE RANDOM ACCESS MEMORY DEVICE AND OPERATING METHOD THEREOF

(71) Applicant: National Chiao Tung University, Hsinchu (TW)

(72) Inventors: Po-Tsun Liu, Hsinchu (TW); Ching-Hui Hsu, Taoyuan County (TW); Yang-Shun Fan, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 36 days.

(21) Appl. No.: 13/753,526

(22) Filed: Jan. 30, 2013

(65) Prior Publication Data

US 2014/0133213 A1 May 15, 2014

(30) Foreign Application Priority Data

Nov. 14, 2012 (TW) ............... 101142391 A (51) Int. Cl.
*G11C 11/00* (2006.01)
*G11C 13/04* (2006.01)

(52) U.S. Cl.
CPC ..................... *G11C 13/04* (2013.01)
USPC ........... 365/148; 365/100; 365/163; 365/175; 365/46

(58) Field of Classification Search
CPC .... G11C 11/00; G11C 11/21; G11C 13/0007; G11C 2213/31; G11C 2213/52; H01L 47/00; H01L 29/04; H01L 29/02; H01L 21/20; H01L 29/06; H01L 45/00
USPC .................... 365/148, 100, 163, 146, 175, 46
See application file for complete search history.

(56) References Cited

U.S. PATENT DOCUMENTS

2013/0026438 A1* 1/2013 Wang et al. .................. 257/4

* cited by examiner

*Primary Examiner* — Thong Q Le
(74) *Attorney, Agent, or Firm* — CKC & Partners Co., Ltd.

(57) ABSTRACT

A resistive random access memory (RRAM) device and operating method are disclosed herein. The RRAM device includes at least one RRAM cell and a control circuit. The RRAM cell includes a bottom electrode, an amorphous Indium-Gallium-Zinc-Oxide (a-IGZO) layer, a Ti layer and a top electrode. The a-IGZO layer is disposed on the bottom layer. The Ti layer is disposed on the a-IGZO layer. The top electrode is disposed on the Ti layer. The control circuit is configured to provide at least one electrical signal to the RRAM cell, so as to change the resistance value of the RRAM cell.

20 Claims, 7 Drawing Sheets

RESISTIVE RANDOM ACCESS MEMORY DEVICE AND OPERATING METHOD THEREOF

RELATED APPLICATIONS

This application claims priority to Taiwan Application Serial Number 101142391, filed Nov. 14, 2012, which is herein incorporated by reference.

BACKGROUND

1. Field of Invention

The present disclosure relates to a memory device and an operating method thereof. More particularly, the present invention relates to a resistive random access memory device and an operating method thereof.

2. Description of Related Art

With advances in technology, non-volatile memories have been widely used in various kinds of electronic devices, such as laptop computers, mobile phones, tablet computers, and so on. The resistive random access memory (RRAM) cell with characteristics of simple structure, low power consumption, low operating voltage, and high operating speed has become an important subject of research in the field of non-volatile memories.

In addition, with advances in display technology, the implementation of system-on-panel (SOP) technology, in which a system is integrated onto a panel, has also become a popular subject of research today. The manufacturing processes associated with non-volatile memories are critical with respect to SOP technology. However, due to the constraints with respect to the manufacturing materials and manufacturing conditions (e.g. temperature used in the manufacturing process) of currently existing non-volatile memories, the manufacturing processes associated with non-volatile memories are not compatible with the manufacturing processes of display panels. Hence, it is still difficult to integrate non-volatile memories into a system-on-panel device.

Hence, to enable more widespread use of the RRAM cell, a new kind of RRAM cell should be provided.

SUMMARY

One aspect of the present invention is directed to an operating method of a resistive random access memory (RRAM) device.

In accordance with one embodiment of the present invention, the RRAM device comprises at least one RRAM cell. The RRAM cell comprises a bottom electrode, an amorphous Indium-Gallium-Zinc-Oxide (a-IGZO) layer disposed on the bottom layer, a Ti layer disposed on the a-IGZO layer, and a top electrode disposed on the Ti layer. The operating method includes providing at least one electrical signal to the RRAM cell, so as to change the resistance value of the RRAM cell.

In accordance with one embodiment of the present invention, the step of providing the at least one electrical signal to the RRAM cell includes providing a set voltage to the RRAM cell, and limiting a current passing through the RRAM cell, so as to change the resistance value of the RRAM cell.

In accordance with one embodiment of the present invention, the RRAM cell has a first resistance value at an initial state, and the step of providing the set voltage to the RRAM cell and limiting the current passing through the RRAM cell includes providing the set voltage to the RRAM cell having the first resistance value, and limiting the current passing through the RRAM cell to a first current limit, such that the resistance value of the RRAM cell is changed to a second resistance value. The second resistance value is smaller than the first resistance value.

In accordance with one embodiment of the present invention, the step of providing the set voltage to the RRAM cell and limiting the current passing through the RRAM cell includes providing the set voltage to the RRAM cell having the first resistance value, and limiting the current passing through the RRAM cell to a second current limit, such that the resistance value of the RRAM cell is changed to a third resistance value; and providing the set voltage to the RRAM cell having the first resistance value, and limiting the current passing through the RRAM cell to a third current limit, such that the resistance value of the RRAM cell is changed to a fourth resistance value. The third current limit is larger than the second current limit, and the second current limit is larger than the first current limit. The fourth resistance value is smaller than the third resistance value, and the third resistance value is smaller than the second resistance value.

In accordance with one embodiment of the present invention, the operating method further includes providing a reset voltage to the RRAM cell after providing the set voltage to the RRAM cell, such that the resistance value of the RRAM cell is reset to the first resistance value.

In accordance with one embodiment of the present invention, the electrical polarity of the set voltage is opposite to the electrical polarity of the reset voltage.

In accordance with one embodiment of the present invention, the step of providing the at least one electrical signal to the RRAM cell includes providing at least one pulse signal to the RRAM cell, so as to change the resistance value of the RRAM cell.

In accordance with one embodiment of the present invention, the RRAM cell has a first resistance value at an initial state, and the step of providing the at least one pulse signal to the RRAM cell includes providing a first pulse signal to the RRAM cell having the first resistance value, such that the resistance value of the RRAM cell is changed to a second resistance value; providing a second pulse signal to the RRAM cell having the second resistance value, such that the resistance value of the RRAM cell is changed to a third resistance value; providing a third pulse signal to the RRAM cell having the third resistance value, such that the resistance value of the RRAM cell is changed to a fourth resistance value; and providing a fourth pulse signal to the RRAM cell having the fourth resistance value, such that the resistance value of the RRAM cell is changed to the first resistance value.

In accordance with one embodiment of the present invention, the electrical polarity of the fourth pulse signal is opposite to the electrical polarity of the third pulse signal, and the electrical polarity of the third pulse signal is the same as the electrical polarities of the second pulse signal and the first pulse signal.

In accordance with one embodiment of the present invention, the amplitude of the third pulse signal is larger than the amplitude of the second pulse signal, and the amplitude of the second pulse signal is larger than the amplitude of the first pulse signal.

In accordance with one embodiment of the present invention, the first resistance value is larger than the second resistance value, the second resistance value is larger than the third resistance value, and the third resistance value is larger than the fourth resistance value.

In accordance with one embodiment of the present invention, the pulse widths of the third pulse signal, the second pulse signal and the first pulse signal are the same, and the pulse width of the fourth pulse signal is greater than the pulse width of the third pulse signal.

Another aspect of the present invention is directed to a RRAM device. In accordance with one embodiment of the present invention, the RRAM device includes at least one RRAM cell and a control circuit. The RRAM cell includes a bottom electrode, an a-IGZO layer disposed on the bottom layer, a Ti layer disposed on the a-IGZO layer, and a top electrode disposed on the Ti layer. The control circuit configured to provide at least one electrical signal to the RRAM cell, so as to change the resistance value of the RRAM cell.

In accordance with one embodiment of the present invention, the control circuit is further configured to provide a set voltage to the RRAM cell and limit a current passing through the RRAM cell, so as to change the resistance value of the RRAM cell.

In accordance with one embodiment of the present invention, the RRAM cell has a first resistance value at an initial state, and when the control circuit provides the set voltage to the RRAM cell having the first resistance value and limits the current passing through the RRAM cell to a first current limit, the resistance value of the RRAM cell is changed to a second resistance value. The second resistance value is smaller than the first resistance value.

In accordance with one embodiment of the present invention, when the control circuit provides the set voltage to the RRAM cell having the first resistance value and limits the current passing through the RRAM cell to a second current limit, the resistance value of the RRAM cell is changed to a third resistance value. Moreover, when the control circuit provides the set voltage to the RRAM cell having the first resistance value and limits the current passing through the RRAM cell to a third current limit, the resistance value of the RRAM cell is changed to a fourth resistance value. The third current limit is larger than the second current limit. The second current limit is larger than the first current limit. The fourth resistance value is smaller than the third resistance value. The third resistance value is smaller than the second resistance value.

In accordance with one embodiment of the present invention, the control circuit is further configured to provide a reset voltage to the RRAM cell after providing the set voltage to the RRAM cell, such that the resistance value of the RRAM cell is reset to the first resistance value.

In accordance with one embodiment of the present invention, the electrical polarity of the set voltage is opposite to the electrical polarity of the reset voltage.

In accordance with one embodiment of the present invention, the control circuit is further configured to provide at least one pulse signal to the RRAM cell, so as to change the resistance value of the RRAM cell.

In accordance with one embodiment of the present invention, the RRAM cell has a first resistance value at an initial state. The control circuit is further configured to provide a first pulse signal to the RRAM cell having the first resistance value, such that the resistance value of the RRAM cell is changed to a second resistance value; to provide a second pulse signal to the RRAM cell having the second resistance value, such that the resistance value of the RRAM cell is changed to a third resistance value; and to provide a fourth pulse signal to the RRAM cell having the fourth resistance value, such that the resistance value of the RRAM cell is changed to the first resistance value.

In accordance with one embodiment of the present invention, the electrical polarity of the fourth pulse signal is opposite to the electrical polarity of the third pulse signal, and the electrical polarity of the third pulse signal is the same as the electrical polarities of the second pulse signal and the first pulse signal.

In accordance with one embodiment of the present invention, the amplitude of the third pulse signal is larger than the amplitude of the second pulse signal, and the amplitude of the second pulse signal is larger than the amplitude of the first pulse signal.

In accordance with one embodiment of the present invention, the first resistance value is larger than the second resistance value, and the second resistance value is larger than the third resistance value, and the third resistance value is larger than the fourth resistance value.

In accordance with one embodiment of the present invention, the pulse widths of the third pulse signal, the second pulse signal and the first pulse signal are the same, and the pulse width of the fourth pulse signal is greater than the pulse width of the third pulse signal.

In summary, by using the embodiments aforementioned, a RRAM device can be realized. The material used to make the transistor layer of the RRAM can be the same as the material used to make the conductive layer of some display panels. In addition, due to the fact that the material used to make the transistor layer of the RRAM can be deposited at or slightly above room temperature (e.g., 27° C.-100° C.), the material used to make the transistor layer of the RRAM can be directly formed on a glass substrate, and this is advantageous in the implementation of a system-on-panel device. Furthermore, in the abovementioned embodiments, by applying pulse signals to the RRAM cell or limiting currents passing through the RRAM cell, the RRAM cell can be switched to a plurality of storage states, such that the storage density of the RRAM cell can be increased.

BRIEF DESCRIPTION OF THE DRAWINGS

The invention can be more fully understood by reading the following detailed description of the embodiments, with reference made to the accompanying drawings as follows.

DETAILED DESCRIPTION

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

Figure 1:
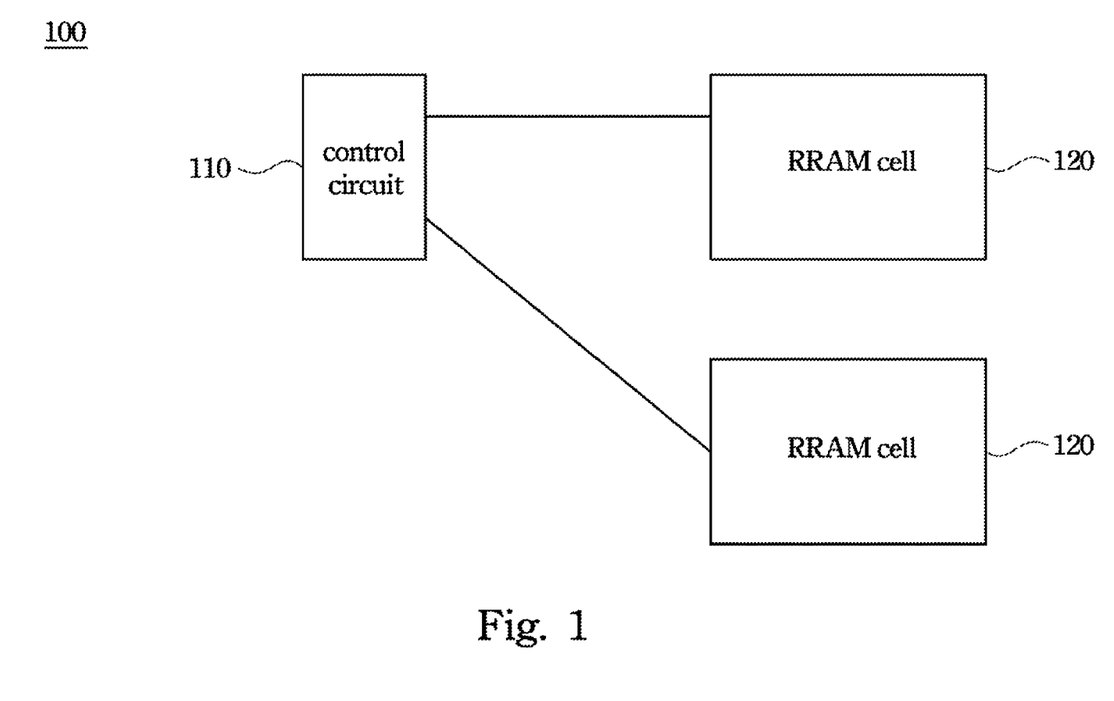
FIG. 1 is a resistive random access memory (RRAM) device in accordance with one embodiment of the present disclosure.

FIG. 1 is a resistive random access memory (RRAM) device 100 in accordance with one embodiment of the present disclosure. The RRAM device 100 includes a control circuit 110 and at least one RRAM cell 120. The control circuit 110 can be electrically connected to the RRAM cell 120, and configured to provide at least one electrical signal (e.g., a voltage or a current) to the RRAM cell 120, so as to change the resistance value of the RRAM cell 120 and thereby switch the RRAM cell 120 to a plurality of storage states. The control circuit 110 can be constructed, for example, with transistors and/or diodes.

Figure 2:
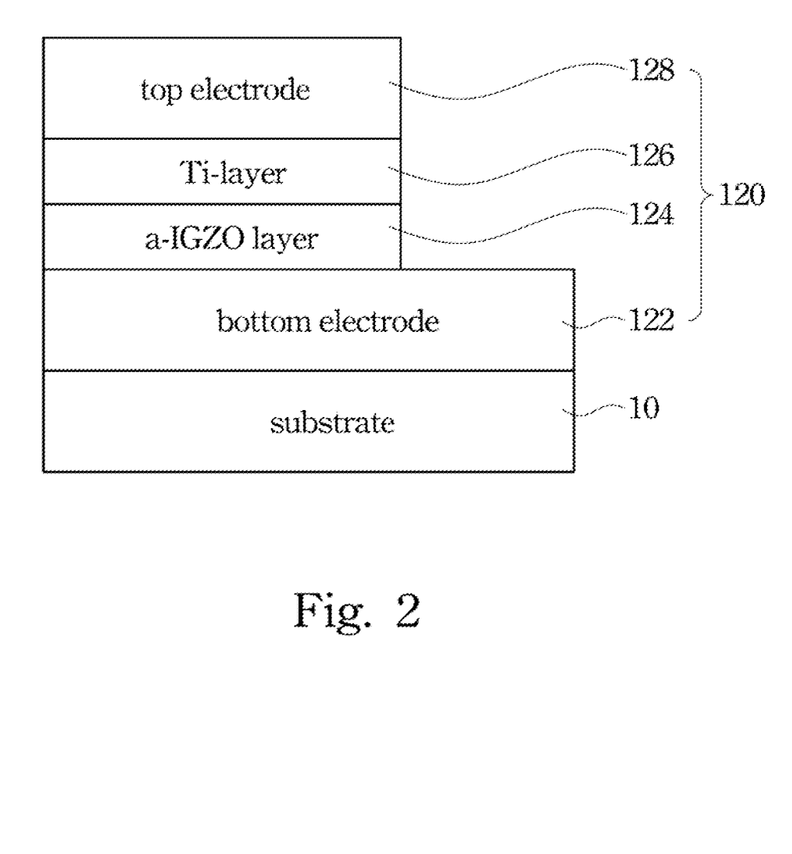
FIG. 2 is a RRAM cell in accordance with one embodiment of the present disclosure.

FIG. 2 is the RRAM cell 120 in accordance with one embodiment of the present disclosure. The RRAM cell 120 can be disposed on a substrate 10. The substrate 10 can be, for example, a silicon substrate or a glass substrate.

The RRAM cell 120 can include a bottom electrode 122, an amorphous Indium-Gallium-Zinc-Oxide (a-IGZO) layer 124, a Ti layer 126, and a top electrode 128. The bottom electrode 122 can be disposed on the substrate 10, and can be made of, for example, Pt, Ir, Au, TiN or any combination of these materials. The a-IGZO layer 124 can be disposed on the bottom electrode 122. The Ti layer 126 can be disposed on the a-IGZO layer 124 to increase the stability of the RRAM cell 120. The top electrode 128 can be disposed on the Ti layer 126, and can be made of, for example, TiN. In addition all of the bottom electrode 122, the a-IGZO layer 124, the Ti layer 126, and top electrode 128 can be manufactured by physical vapor deposition at or slightly above room temperature (e.g., 27° C.-100° C.).

In one embodiment, the thickness of the bottom electrode 122 can be, for example, 60 nanometers; the thickness of the a-IGZO layer 124 can be, for example, 50 nanometers; the thickness of the Ti layer 126 can be, for example, 10 nanometers; and the thickness of the top electrode 128 can be, for example, 70 nanometers.

In addition, in one embodiment, another Ti layer or a NiO2 layer (not shown) can be disposed between the RRAM cell 120 and the substrate 10, so that the bottom layer 122 is better adhered on the substrate 10. The thickness of this Ti layer or NiO2 layer can be, for example, 20 nanometers.

With such a configuration (of the RRAM cell 120), due to the resistance switching characteristic of the a-IGZO layer 124, the resistance value of the RRAM cell 120 can be changed while receiving the at least one electrical signal, and therefore the RRAM cell 120 can have a plurality of storage states. Moreover, in the abovementioned embodiment, the material used to make the transistor layer of the RRAM is a-IGZO which can be the same material used to make the conductive layer of some display panels. In addition the RRAM cell 120 can be manufactured in such a manner that each layer thereof is deposited at room temperature, and hence, the RRAM cell 120 can be directly formed on a flexible substrate or glass substrate (having a melting point of about 350° C.). Therefore, the manufacturing processes of the RRAM cell 120 can be easily integrated into the manufacturing processes of a display panel, and this is advantageous in the implementation of a system-on-panel device.

In the following paragraphs, an operating method of the RRAM device 100 will be described, in which the RRAM cell 120 can have different storage states depending on the variation of the resistance values thereof. The RRAM device 100 can provide the at least one electrical signal to the RRAM cell 120 by the control circuit 110 to change the resistance value of the RRAM cell 120, such that the RRAM cell 120 can have at least two storage states to save data. In the following description, the RRAM cell 120 is described as having four storage states as an example. However, one skilled in the art can adjust the at least one electrical signal provided to the RRAM cell 120, to make the RRAM cell 120 have a different quantity of storage states. The quantity of storage states of the RRAM cell 120 is not limited to that described in the embodiments of the present disclosure.

In addition, the operating method can be applied to a RRAM device having a structure that is the same as or similar to the structure shown in FIG. 1 and FIG. 2. To simplify the description below, in the following paragraphs, the embodiments shown in FIG. 1 and FIG. 2 will be used as an example to describe the operating method according to embodiments of the present disclosure. However, the invention is not limited to application to the embodiments shown in FIGS. 1 and 2.

In the first embodiment of the present disclosure, the control circuit 110 can provide a set voltage Vset to the RRAM cell 120 and limit a current passing through the RRAM cell 120, so as to change the resistance value of the RRAM cell 120, that is, change the RRAM cell 120 from a high-resistive state to a low-resistive state.

Figure 3:
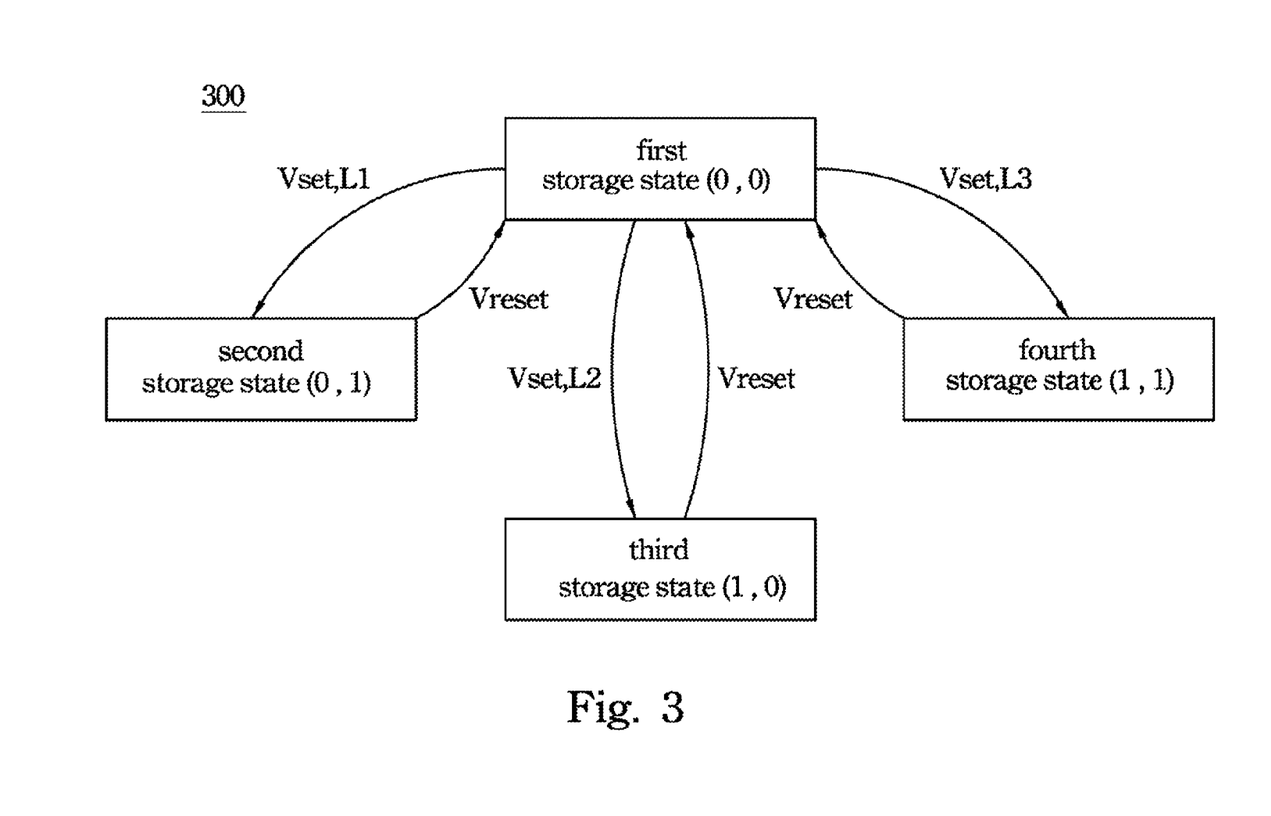
FIG. 3 is an operating method of the RRAM device in accordance with the first embodiment of the present disclosure.

FIG. 3 is an operating method 300 of the RRAM device 100 in accordance with the first embodiment of the present disclosure.

At an initial state, the RRAM cell 120 has a first resistance value, and the RRAM cell 120 is at a first storage state (0, 0).

When the control circuit 110 provides the set voltage Vset to the RRAM cell 120 having the first resistance value (i.e., to the RRAM cell 120 at the first storage state (0, 0)) and limits the current passing through the RRAM cell 120 to a first current limit L1 the resistance value of the RRAM cell 120 is changed from the first resistance value to a second resistance value, and the RRAM cell 120 is transited from the first storage state (0, 0) to a second storage state (0, 1), The second resistance value is smaller than the first resistance value.

When the control circuit 110 provides the set voltage Vset to the RRAM cell 120 having the first resistance value (i.e., to the RRAM cell 120 at the first storage state (0, 0)) and limits the current passing through the RRAM cell 120 to a second current limit L2, the resistance value of the RRAM cell 120 is changed from the first resistance value to a third resistance value, and the RRAM cell 120 is transited from the first storage state (0, 0) to a third storage state (1, 0).

When the control circuit 110 provides the set voltage Vset to the RRAM cell 120 having the first resistance value (i.e., to the RRAM at the first storage state (0, 0)) and limits the current passing through the RRAM cell 120 to a third current limit L3, the resistance value of the RRAM cell 120 is changed from the first resistance value to a fourth resistance value, and the RRAM cell 120 is transited from the first storage state (0, 0) to a fourth storage state (1, 1).

After providing the set voltage Vset to the RRAM cell 120 (that is, when the RRAM cell 120 is at the second, the third, or the fourth storage state (0, 1), (1, 0), (1, 1)), the control circuit 110 can provide a reset voltage Vreset to the RRAM cell 120 such that the resistance value of the RRAM cell is reset to the first resistance value (that is, the RRAM cell 120 is transited to the first storage state (0, 0)).

In such a way, the RRAM cell 120 can be switched between different storage states to store data.

In summary, the operating method 300 of the RRAM device 100 according to the abovementioned first embodiment involves limiting the current passing through the RRAM cell 120 to a plurality of current limits, such that the resistance value of the RRAM cell 120 can be changed to the resistance values corresponding to these current limits, and in such a way, a single RRAM cell 120 can store digital information of more than one bit.

In addition, when the RRAM cell 120 is transited from a high-resistive state to a low-resistive state, the larger the current limit which limits the current passing through the RRAM cell 120, the smaller the resistance value of the RRAM cell 120. For example, if the third current limit L3 is larger than the second limit L2 and the second current limit L2 is larger than the first limit L1 then the fourth resistance value is smaller than the third resistance value and the third resistance value is smaller than the second resistance value.

Moreover, the electrical polarity of the set voltage Vset is opposite to the electrical polarity of the reset voltage Vreset. For example, the reset voltage Vreset can be a negative voltage, and the set voltage Vset can be a positive voltage. In one embodiment, the reset voltage Vreset can be, for example, −2 volts; the set voltage Vset can be, for example, 2 volts the third current limit L3 can be, for example, 0.2 milliamperes; the second current limit L2 can be, for example, 0.5 milliamperes; and the first current limit L1 can be, for example, 2 milliamperes. It should be noted that these values are merely examples, and the invention is not limited to these values.

Figure 4:
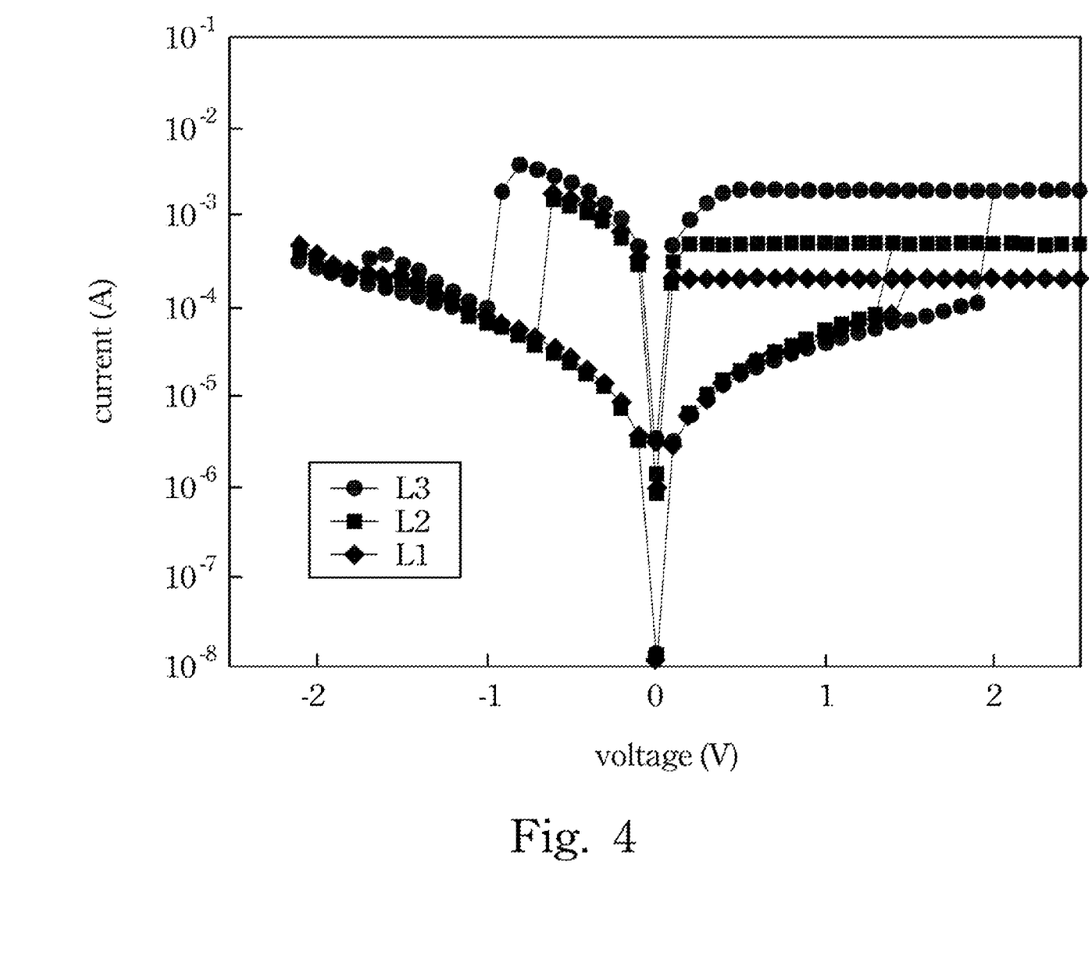
FIG. 4 is a diagram illustrating a resistive switching behavior of the RRAM cell when subjected to different current limits in accordance with one embodiment of the present disclosure.
Figure 5:
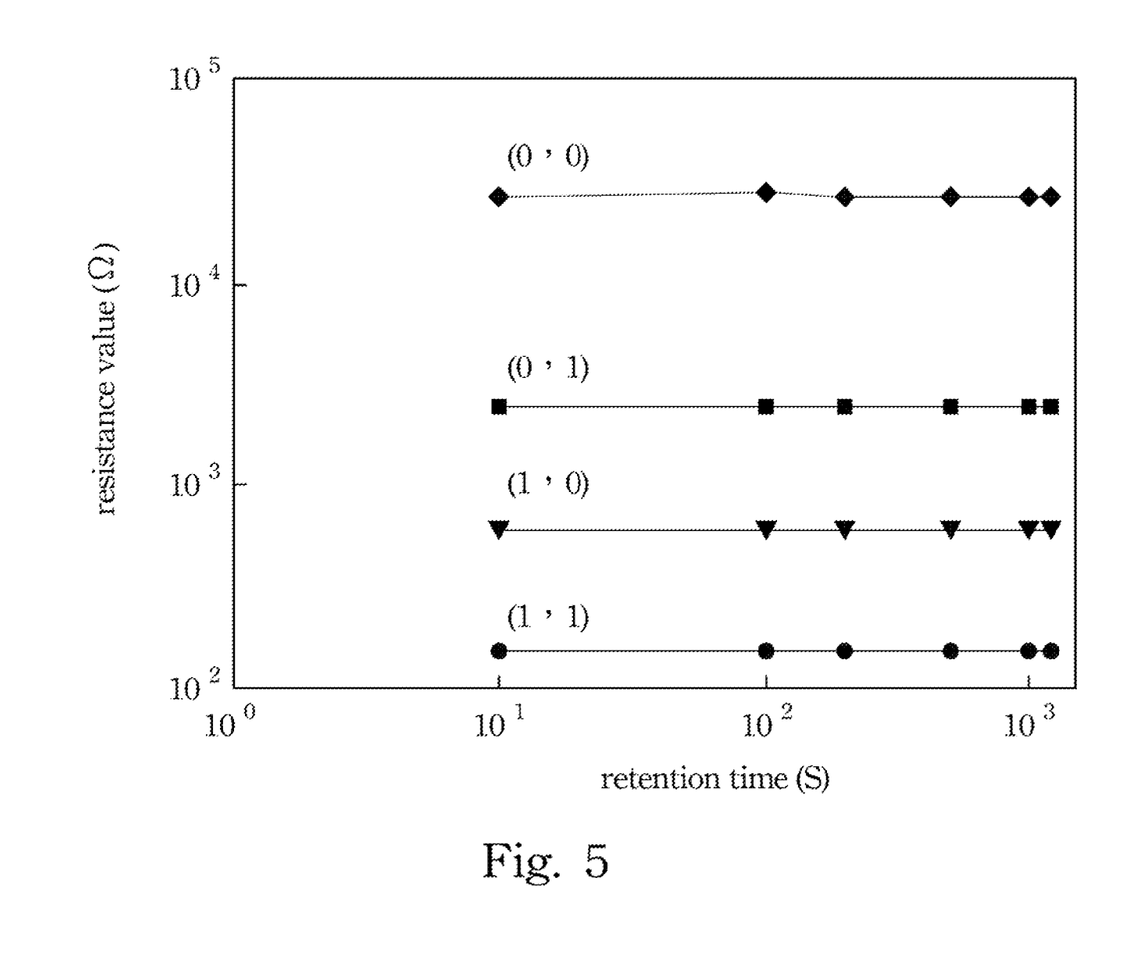
FIG. 5 is a diagram illustrating a data retention capability of the RRAM cell in accordance with one embodiment of the present disclosure.

FIG. 4 and FIG. 5 illustrate the characteristics of the RRAM 120 in the abovementioned operating method 300.

FIG. 4 is a diagram illustrating a resistive switching behavior of the RRAM cell 120 when subjected to different current limits L1-L3 in accordance with one embodiment of the present disclosure. As shown in this figure, by limiting the current passing through the RRAM cell 120 to different current limits, the resistance value of the RRAM 120 after the RRAM 120 is transited from a high-resistance state to a low-resistance state when receiving the set voltage Vset (e.g., 2 volts) can be controlled, such that a single RRAM cell 120 can store digital information of more than one bit.

FIG. 5 is a diagram illustrating the data retention capability of the RRAM cell 120 in accordance with one embodiment of the present disclosure. As shown in FIG. 5, at each storage state, the RRAM cell 120 keeps receiving a read voltage (e.g., 0.2 volts), and as a result, the resistance value of the RRAM 120 can be maintained at a steady level.

In the following paragraphs, the second embodiment of the present disclosure will be described. In this embodiment, the control circuit 110 can change the resistance value of the RRAM cell 120 by providing at least one pulse signal to the RRAM cell 120.

Figure 6:
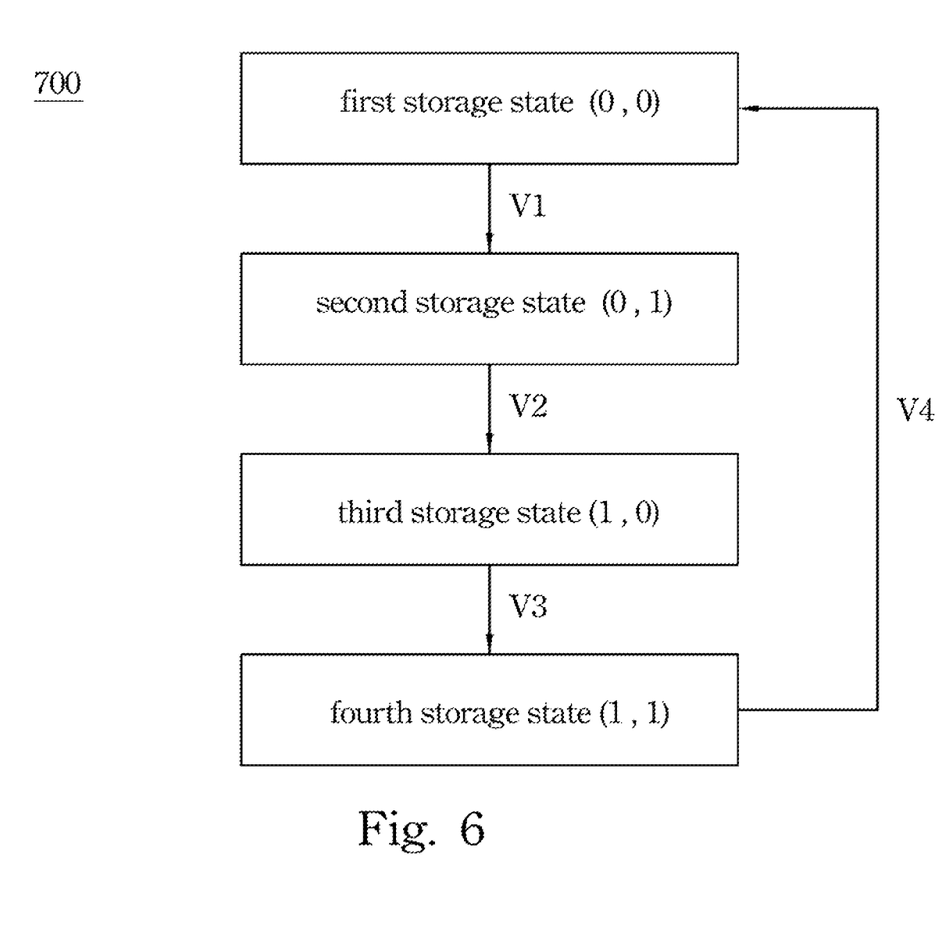
FIG. 6 is an operating method of the RRAM device in accordance with the second embodiment of the present disclosure.
Figure 7:
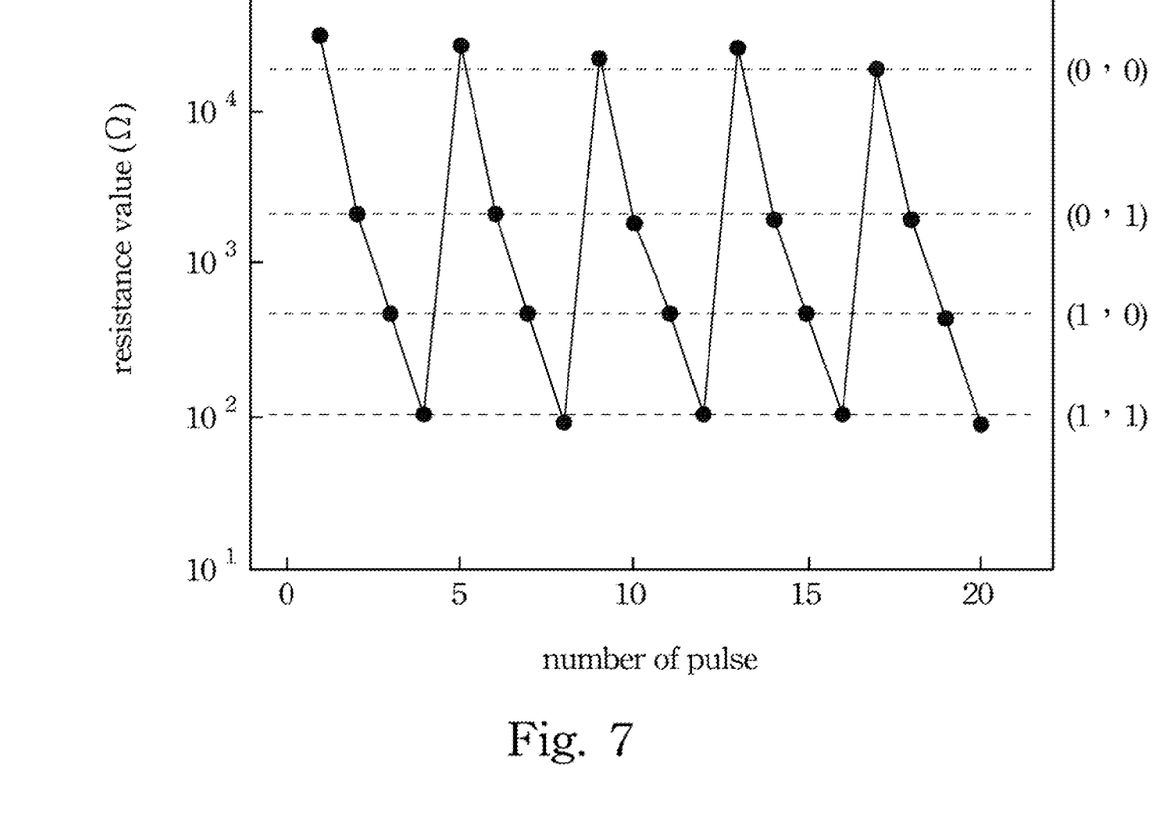
FIG. 7 is a diagram illustrating transitions between storage states of the RRAM cell in accordance with the second embodiment of the present disclosure.

FIG. 6 is an operating method 700 in accordance with the second embodiment of the present disclosure. FIG. 7 is a diagram illustrating transitions between storage states of the RRAM cell 120 in accordance with the second embodiment of the present disclosure.

Referring to FIG. 6 and FIG. 7, at an initial state, the RRAM cell 120 has a first resistance value, and the RRAM cell 120 is at a first storage state (0, 0).

When the RRAM cell 120 has the first resistance value (i.e., at the first storage state (0, 0)), the control circuit 110 can provide a first pulse signal V1 to the RRAM cell 120, such that the resistance value of the RRAM cell 120 can be changed to a second resistance value, and the RRAM cell 120 is transited to a second storage state (0, 1).

When the RRAM cell 120 has the second resistance value (i.e., is at the second storage state (0, 1)), the control circuit 110 can provide a second pulse signal V2 to the RRAM cell 120, such that the resistance value of the RRAM cell 120 can be changed to a third resistance value, and the RRAM cell 120 is transited to a third storage state (1, 0).

When the RRAM cell 120 has the third resistance value (i.e., is at the third storage state (1, 0)), the control circuit 110 can provide a third pulse signal V3 to the RRAM cell 120, such that the resistance value of the RRAM cell 120 can be changed to a fourth resistance value, and the RRAM cell 120 is transited to a fourth storage state (1, 1).

When the RRAM cell 120 has the fourth resistance value (i.e., is at the fourth storage state (1, 1)), the control circuit 110 can provide a fourth pulse signal V4 to the RRAM cell 120, such that the resistance value of the RRAM cell 120 can be changed to the first resistance value, and the RRAM cell 120 is transited to the first storage state (0, 0).

In such a way, the RRAM cell 120 can be switched between different storage states.

In summary, the operating method in the second embodiment abovementioned involves providing different pulse signals in a manner corresponding to the RRAM cell 120 with different storage states, such that the resistance value of the RRAM cell 120 can be changed to correspond to these pulse signals, and in this way, a single RRAM cell 120 can store digital information of more than one bit.

In the second embodiment, the electrical polarities of the first pulse signal V1, the second pulse signal the V2, and the third pulse signal V3 are the same, and these signals can be, for example, positive pulse signals. The electrical polarity of the fourth pulse signal V4 is different from the electrical polarities of the first pulse signal V1, the second pulse signal the V2, and the third pulse signal V3, and the fourth pulse signal V4 can be, for example, a negative pulse signal. The amplitude of the third pulse signal V3 can be larger than the amplitude of the second pulse signal V2, and the amplitude of the second pulse signal V2 can be larger than the amplitude of the first pulse signal V1 The first resistance value can be larger than the second resistance value, the second resistance value can be larger than the third resistance value, and the third resistance value can be larger than the fourth resistance value.

In addition, the pulse widths of the third pulse signal V3, the second pulse signal V2 and the first pulse signal V1 are the same, and the pulse width of the fourth pulse signal V4 is greater than the pulse widths of the third pulse signal V3, the second pulse signal V2 and the first pulse signal V1.

In one embodiment, the amplitude of the first pulse signal V1 is, for example, 1 volt, and the pulse width of the first pulse signal V1 is, for example, 50 nanoseconds. The amplitude of the second pulse signal V2 is, for example, 1.5 volts, and the pulse width of the second pulse signal V2 is, for example, 50 nanoseconds. The amplitude of the third pulse signal V3 is, for example, 2.5 volts, and the pulse width of the third pulse signal V3 is, for example, 50 nanoseconds. The amplitude of the fourth pulse signal V4 is, for example, −1.5 volts, and the pulse width of the fourth pulse signal V4 is, for example, microsecond.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An operating method of a resistive random access memory (RRAM) device, wherein the RRAM device comprises at least one RRAM cell, wherein the operating method comprises:

providing at least one electrical signal to the RRAM cell, so as to change the resistance value of the RRAM cell, wherein the RRAM cell comprises a bottom electrode, an amorphous Indium-Gallium-Zinc-Oxide (a-IGZO) layer disposed on the bottom electrode, a Ti layer disposed on the a-IGZO layer, and a top electrode disposed on the Ti layer.

2. The operating method as claimed in claim 1, wherein the step of providing the at least one electrical signal to the RRAM cell comprises:
providing a set voltage to the RRAM cell, and limiting a current passing through the RRAM cell, so as to change the resistance value of the RRAM cell.

3. The operating method as claimed in claim 2, wherein the RRAM cell has a first resistance value at an initial state, the step of providing the set voltage to the RRAM cell and limiting the current passing through the RRAM cell comprises:
providing the set voltage to the RRAM cell having the first resistance value, and limiting the current passing through the RRAM cell to a first current limit, such that the resistance value of the RRAM cell is changed to a second resistance value, wherein the second resistance value is smaller than the first resistance value.

4. The operating method as claimed in claim 3, wherein the step of providing the set voltage to the RRAM cell and limiting the current passing through the RRAM cell further comprises:
providing the set voltage to the RRAM cell having the first resistance value, and limiting the current passing through the RRAM cell to a second current limit, such that the resistance value of the RRAM cell is changed to a third resistance value; and
providing the set voltage to the RRAM cell having the first resistance value, and limiting the current passing through the RRAM cell to a third current limit, such that the resistance value of the RRAM cell is changed to a fourth resistance value;
wherein the third current limit is larger than the second current limit, the second current limit is larger than the first current limit, the fourth resistance value is smaller than the third resistance value, and the third resistance value is smaller than the second resistance value.

5. The operating method as claimed in claim 2, further comprising:
providing a reset voltage to the RRAM cell after providing the set voltage to the RRAM cell, such that the resistance value of the RRAM cell is reset to the first resistance value, wherein the electrical polarity of the set voltage is opposite to the electrical polarity of the reset voltage.

6. The operating method as claimed in claim 1, wherein the step of providing the at least one electrical signal to the RRAM cell comprises:
providing at least one pulse signal to the RRAM cell, so as to change the resistance value of the RRAM cell.

7. The operating method as claimed in claim 6, wherein the RRAM cell has a first resistance value at an initial state, the step of providing the at least one pulse signal to the RRAM cell comprises:
providing a first pulse signal to the RRAM cell having the first resistance value, such that the resistance value of the RRAM cell is changed to a second resistance value;
providing a second pulse signal to the RRAM cell having the second resistance value, such that the resistance value of the RRAM cell is changed to a third resistance value;
providing a third pulse signal to the RRAM cell having the third resistance value, such that the resistance value of the RRAM cell is changed to a fourth resistance value; and providing a fourth pulse signal to the RRAM cell having the fourth resistance value, such that the resistance value of the RRAM cell is changed to the first resistance value.

8. The operating method as claimed in claim 7, wherein the electrical polarity of the fourth pulse signal is opposite to the electrical polarity of the third pulse signal, the electrical polarity of the third pulse signal is the same as the electrical polarities of the second pulse signal and the first pulse signal.

9. The operating method as claimed in claim 7, wherein the amplitude of the third pulse signal is larger than the amplitude of the second pulse signal, and the amplitude of the second pulse signal is larger than the amplitude of the first pulse signal.

10. The operating method as claimed in claim 7, wherein the first resistance value is larger than the second resistance value, the second resistance value is larger than the third resistance value, and the third resistance value is larger than the fourth resistance value,
wherein the pulse widths of the third pulse signal, the second pulse signal and the first pulse signal are the same, and the pulse width of the fourth pulse signal is greater than the pulse width of the third pulse signal.

11. A RRAM device, comprising:
at least one RRAM cell, comprising:
a bottom electrode;
an amorphous Indium-Gallium-Zinc-Oxide (a-IGZO) layer disposed on the bottom electrode;
a Ti layer disposed on the a-IGZO layer; and
a top electrode disposed on the Ti layer; and
a control circuit configured to provide at least one electrical signal to the RRAM cell, so as to change the resistance value of the RRAM cell.

12. The RRAM device as claimed in claim 11, wherein the control circuit is further configured to provide a set voltage to the RRAM cell and limit a current passing through the RRAM cell, so as to change the resistance value of the RRAM cell.

13. The RRAM device as claimed in claim 12, wherein the RRAM cell has a first resistance value at an initial state,
wherein when the control circuit provides the set voltage to the RRAM cell having the first resistance value and limits the current passing through the RRAM cell to a first current limit, the resistance value of the RRAM cell is changed to a second resistance value,
and wherein the second resistance value is smaller than the first resistance value.

14. The RRAM device as claimed in claim 13, wherein when the control circuit provides the set voltage to the RRAM cell having the first resistance value and limits the current passing through the RRAM cell to a second current limit, the resistance value of the RRAM cell is changed to a third resistance value,
wherein when the control circuit provides the set voltage to the RRAM cell having the first resistance value and limits the current passing through the RRAM cell to a third current limit, the resistance value of the RRAM cell is changed to a fourth resistance value,
wherein the third current limit is larger than the second current limit, the second current limit is larger than the first current limit, the fourth resistance value is smaller than the third resistance value, and the third resistance value is smaller than the second resistance value.

15. The RRAM device as claimed in claim 12, wherein the control circuit is further configured to provide a reset voltage to the RRAM cell after providing the set voltage to the RRAM cell, such that the resistance value of the RRAM cell is reset to the first resistance value, wherein the electrical polarity of the set voltage is opposite to the electrical polarity of the reset voltage.

16. The RRAM device as claimed in claim 11, wherein the control circuit is further configured to provide at least one pulse signal to the RRAM cell, so as to change the resistance value of the RRAM cell.

17. The RRAM device as claimed in claim 16, wherein the RRAM cell has a first resistance value at an initial state,
   wherein the control circuit is further configured to provide a first pulse signal to the RRAM cell having the first resistance value, such that the resistance value of the RRAM cell is changed to a second resistance value,
   the control circuit is further configured to provide a second pulse signal to the RRAM cell having the second resistance value, such that the resistance value of the RRAM cell is changed to a third resistance value,
   the control circuit is further configured to provide a third pulse signal to the RRAM cell having the third resistance value, such that the resistance value of the RRAM cell is changed to a fourth resistance value, and
   the control circuit is further configured to provide a fourth pulse signal to the RRAM cell having the fourth resistance value, such that the resistance value of the RRAM cell is changed to the first resistance value.

18. The RRAM device as claimed in claim 17, wherein the electrical polarity of the fourth pulse signal is opposite to the electrical polarity of the third pulse signal, and the electrical polarity of the third pulse signal is the same as the electrical polarities of the second pulse signal and the first pulse signal.

19. The RRAM device as claimed in claim 17, wherein the amplitude of the third pulse signal is larger than the amplitude of the second pulse signal, and the amplitude of the second pulse signal is larger than the amplitude of the first pulse signal.

20. The RRAM device as claimed in claim 17, wherein the first resistance value is larger than the second resistance value, the second resistance value is larger than the third resistance value, and the third resistance value is larger than the fourth resistance value,
   wherein the pulse widths of the third pulse signal, the second pulse signal and the first pulse signal are the same, and the pulse width of the fourth pulse signal is greater than the pulse width of the third pulse signal.

* * * * *